(12) United States Patent
Wu et al.

(10) Patent No.: US 9,793,358 B2
(45) Date of Patent: *Oct. 17, 2017

(54) NON-PLANAR SEMICONDUCTOR DEVICE WITH MULTIPLE-HEAD EPITAXIAL STRUCTURE ON FIN

(71) Applicant: GLOBALFOUNDRIES Inc., Grand Cayman (KY)

(72) Inventors: Xusheng Wu, Ballston Lake, NY (US); Xiang Hu, Clifton Park, NY (US); Changyong Xiao, Mechanicville, NY (US); Wanxun He, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 775 days.

This patent is subject to a terminal disclaimer.

(21) Appl. No.: 14/267,541

(22) Filed: May 1, 2014

(65) Prior Publication Data
US 2015/0318351 A1 Nov. 5, 2015

(51) Int. Cl.
*H01L 29/78* (2006.01)
*H01L 29/06* (2006.01)
(Continued)

(52) U.S. Cl.
CPC ........ *H01L 29/161* (2013.01); *H01L 21/0243* (2013.01); *H01L 21/0259* (2013.01);
(Continued)

(58) Field of Classification Search
CPC ............. H01L 21/302; H01L 21/02381; H01L 21/0243; H01L 21/02532; H01L 21/0259;
(Continued)

(56) References Cited

U.S. PATENT DOCUMENTS 8,878,300 B1 * 11/2014 Liu .................... H01L 29/785
257/368
9,159,630 B1  10/2015 Wei
(Continued)

OTHER PUBLICATIONS

Wu et al., Office Action dated Aug. 18, 2015 for U.S. Appl. No. 14/267,611, filed May 1, 2014.
(Continued)

*Primary Examiner* — Marc Armand
*Assistant Examiner* — Younes Boulghassoul
(74) *Attorney, Agent, or Firm* — Wayne F. Reinke, Esq.; Heslin Rothenberg Farley & Mesiti P.C.

(57) ABSTRACT

A non-planar semiconductor structure includes raised semiconductor structures, e.g., fins, having epitaxial structures grown on top surfaces thereof, for example, epitaxial silicon naturally growing into a diamond shape. The surface area of the epitaxial structure may be increased by removing portion(s) thereof. The removal may create a multi-head (e.g., dual-head) epitaxial structure, together with the neck of the raised structure resembling a Y-shape. Raised structures that are not intended to include an epitaxial structure will be masked during epitaxial structure creation and modification. In addition, in order to have a uniform height, the filler material surrounding the raised structures is recessed around those to receive epitaxial structures.

10 Claims, 13 Drawing Sheets

(51) Int. Cl.
- *H01L 29/161* (2006.01)
- *H01L 27/088* (2006.01)
- *H01L 21/8234* (2006.01)
- *H01L 21/02* (2006.01)

(52) U.S. Cl.
CPC .. *H01L 21/02381* (2013.01); *H01L 21/02532* (2013.01); *H01L 21/02639* (2013.01); *H01L 21/02664* (2013.01); *H01L 21/823431* (2013.01); *H01L 27/0886* (2013.01); *H01L 29/0657* (2013.01); *H01L 29/7853* (2013.01)

(58) Field of Classification Search
CPC ......... H01L 21/02639; H01L 21/02664; H01L 21/823431; H01L 21/823; H01L 21/02; H01L 21/8234; H01L 21/308; H01L 21/8238; H01L 21/306; H01L 21/823821; H01L 21/02546; H01L 21/30604; H01L 21/823807; H01L 21/02538; H01L 21/0223; H01L 21/02065; H01L 21/265; H01L 21/336; H01L 21/02529; H01L 29/785; H01L 29/161; H01L 29/0657; H01L 29/7853; H01L 29/06; H01L 29/78; H01L 29/16; H01L 29/201; H01L 29/0692; H01L 29/20; H01L 29/7848; H01L 29/66795; H01L 29/66818; H01L 29/66; H01L 29/165; H01L 27/0886; H01L 27/088; H01L 27/092; H01L 27/0922; H01L 2/0924

USPC ................. 257/616, 623, 264, 283, 77, 288, 257/E27.062, E29.255, E21.634, E31.409; 438/478, 778, 230, 303, 197

See application file for complete search history.

(56) References Cited

U.S. PATENT DOCUMENTS

| | | |
|---|---|---|
| 9,275,906 B2 | 3/2016 | Wu et al. |
| 9,379,025 B1* | 6/2016 | Basker ............ H01L 21/823821 |
| 9,508,794 B2 | 11/2016 | Wu et al. |
| 9,601,619 B2* | 3/2017 | Sung ............... H01L 21/823412 |
| 9,679,977 B2* | 6/2017 | Kim .................... H01L 29/41783 |
| 9,680,020 B2* | 6/2017 | Basker ................ H01L 29/7851 |
| 2012/0280250 A1* | 11/2012 | Basker ............ H01L 21/823821 257/77 |
| 2013/0069128 A1 | 3/2013 | Okano |
| 2015/0137181 A1 | 5/2015 | Basker et al. |
| 2015/0170916 A1* | 6/2015 | Yu ..................... H01L 21/02664 438/493 |
| 2015/0255604 A1* | 9/2015 | Yang .................. H01L 29/7848 257/192 |
| 2016/0020301 A1* | 1/2016 | Park .................. H01L 29/66636 257/283 |

OTHER PUBLICATIONS

Wu et al., "Mixed N/P Type Non-Planar Semiconductor Structure with Multiple Epitaxial Heads and Method of Making Same," U.S. Appl. No. 14/267,611, filed May 1, 2014.

* cited by examiner

NON-PLANAR SEMICONDUCTOR DEVICE WITH MULTIPLE-HEAD EPITAXIAL STRUCTURE ON FIN

BACKGROUND OF THE INVENTION

Technical Field

The present invention generally relates to non-planar semiconductor structures with epitaxial structures on top surfaces of raised semiconductor structures. More specifically, the present invention relates to increasing the surface area of the epitaxial structures without adding additional epitaxial material.

Background Information

With the ever-shrinking sizes of semiconductor devices, creativity in design has allowed the decrease in size to continue. For example, non-planar devices with raised semiconductor structures (e.g., "fins") were an important breakthrough, while the inclusion of epitaxial semiconductor structures at the top surface of the raised structures further extended the breakthrough of non-planar devices. However, as dimensions continue their downward march, the real-world sub-structures produced stray farther and farther from the ideal dimensions and/or shape. For example, the raised structures have a tapered shape, getting gradually large from tip to base, the tip being the location for the epitaxial structure. In turn, the epitaxial structure is smaller, the surface area of which largely determines current throughput, and, hence a key performance contributor.

Therefore, a need continues to exist for a way to improve semiconductor performance, and, in particular, current throughput, bearing in mind existing design constraints with regard to the total height of the raised structure with epitaxial structure on top.

SUMMARY OF THE INVENTION

The shortcomings of the prior art are overcome and additional advantages are provided through the provision, in one aspect, of a method of fabricating a non-planar semiconductor structure with multiple epitaxial heads. The method includes providing a starting non-planar semiconductor structure, the structure including a semiconductor substrate and at least one raised semiconductor structure coupled to the substrate. The method further includes growing at least one epitaxial structure on a top surface of one or more of the at least one raised semiconductor structure, the at least one epitaxial structure having a surface area, and increasing the surface area of the at least one epitaxial structure without growing additional epitaxy.

In accordance with another aspect, a non-planar semiconductor structure is provided. The structure includes a semiconductor substrate, at least one raised semiconductor structure coupled to the substrate, and at least one epitaxial structure grown on a partially recessed top surface of one or more of the at least one raised semiconductor structure, the at least one epitaxial structure including at least two epitaxial head structures joined together at a common base of the at least one epitaxial structure.

These, and other objects, features and advantages of this invention will become apparent from the following detailed description of the various aspects of the invention taken in conjunction with the accompanying drawings.

DETAILED DESCRIPTION OF THE INVENTION

Figure 1:
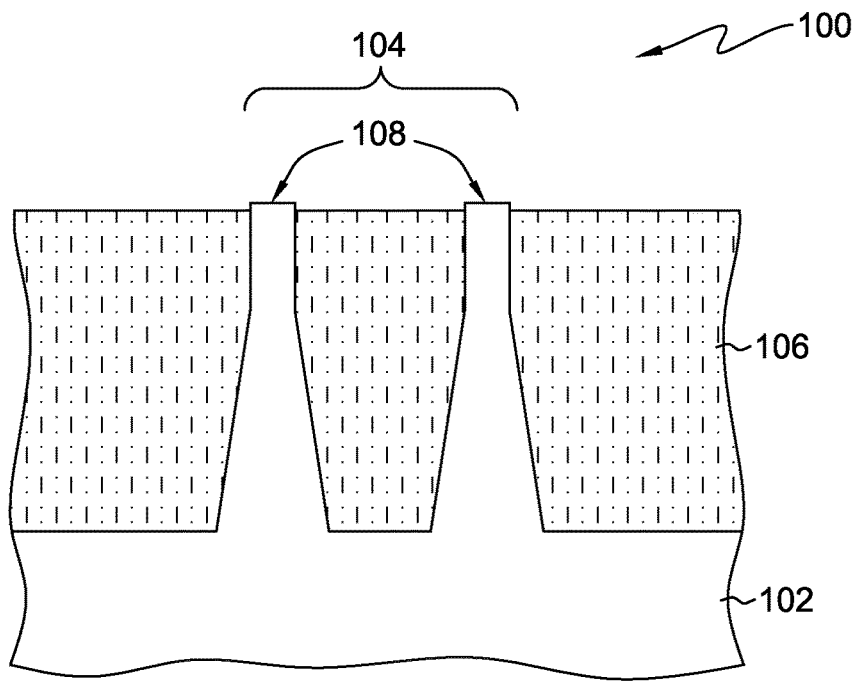
FIG. 1 depicts one example of a starting non-planar semiconductor structure in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

In one aspect, the present invention presents a method of fabricating a non-planar semiconductor structure with multiple epitaxial heads. The method includes providing a starting non-planar semiconductor structure. FIG. 1 depicts one example of a starting non-planar semiconductor structure 100, the starting structure including a semiconductor substrate 102 and one or more raised semiconductor structures 104 coupled to the substrate. As used herein, the term "raised semiconductor structure" refers to a structure that is raised with respect to the substrate (e.g., a "Fin"), creating a non-planar structure. In one example, the raised structures have been etched from the same bulk semiconductor as the substrate. As will be explained in more detail with respect to FIG. 3, one or more epitaxial structure(s) is to be grown on a top surface of one or more of the raised semiconductor structure(s).

Figure 2:
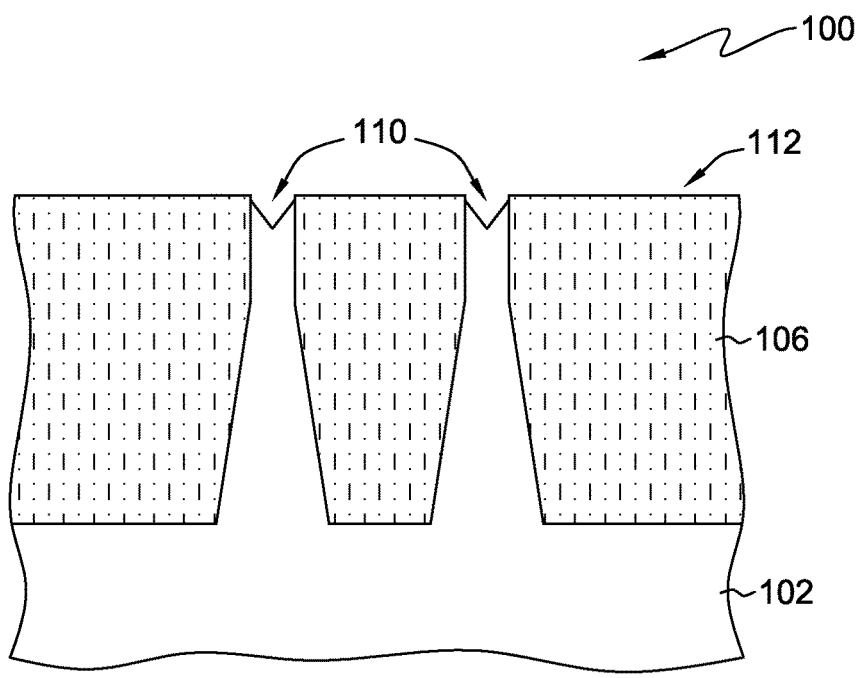
FIG. 2 depicts one example of the structure of FIG. 1 after recessing the raised structures below the layer of filler material in accordance with one or more aspects of the present invention.
Figure 3:
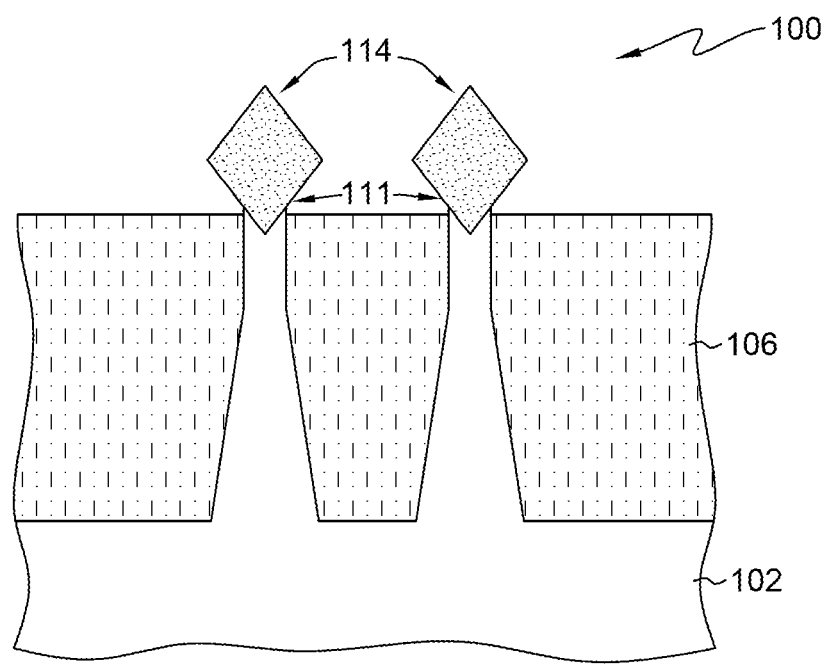
FIG. 3 depicts one example of the structure of FIG. 2 after growing epitaxial structures on top surfaces of the raised structures in accordance with one or more aspects of the present invention.
Figure 4:
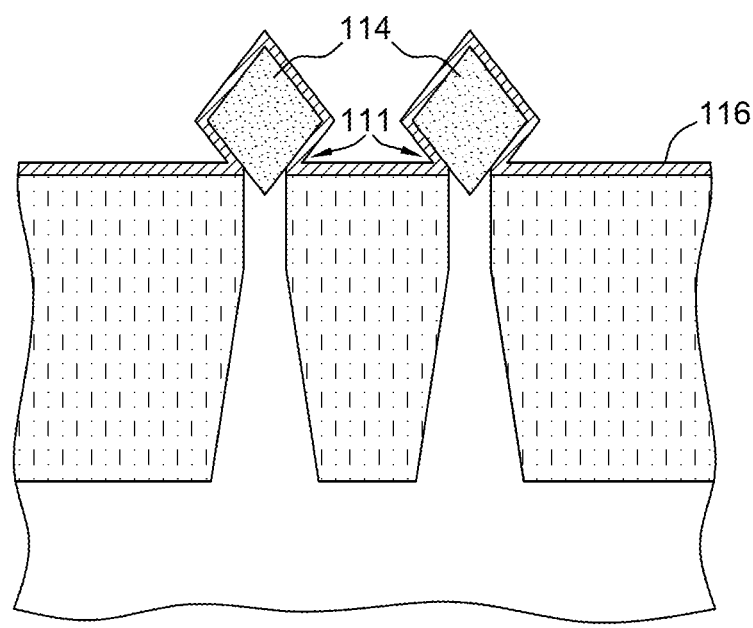
FIG. 4 depicts one example of the structure of FIG. 3 after deposition of a blanket layer of protective material in accordance with one or more aspects of the present invention.

Returning to FIG. 1, the starting non-planar semiconductor structure further includes a filler layer 106 of at least one filler material (e.g., a dielectric, for example, an oxide)

conformally surrounding the raised semiconductor structure(s) while exposing a top surface 108 thereof. As shown in FIGS. 2 and 3, growing the epitaxial structure(s) includes recessing the exposed top surface 110 below a top surface 112 of the filler layer, and growing the epitaxial structure(s) 114, which have a surface area, on the recessed top surface of the raised semiconductor structure(s). Each of the epitaxial structures has a base 111 in the recess, which will serve as a common base for a dual-headed structure subsequently formed (see, e.g., FIG. 11). The recess may be accomplished, for example, using a conventional wet etch process, for example, ammonia or TMAH solution may be used for silicon.

The epitaxial structure(s) may include a single epitaxial material, for example, silicon, germanium, or a combination of semiconductor materials, for example, silicon germanium. More broadly, the epitaxial structure(s) may include a combination of materials (e.g., two or more) from Groups III-V of the Periodic Table of Elements. In the example of FIG. 3, epitaxial silicon is used as the epitaxial material, which, as one skilled in the art sill know, naturally grows into a diamond shape.

Figure 5:
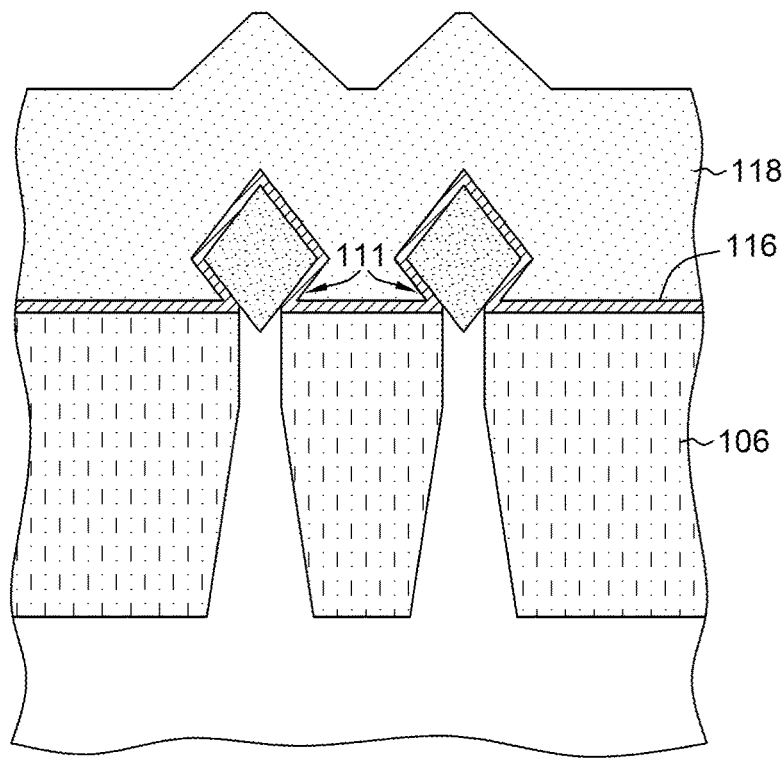
FIG. 5 depicts one example of the structure of FIG. 4 after conformal deposition of the filler material over the protective layer in accordance with one or more aspects of the present invention.
Figure 6:
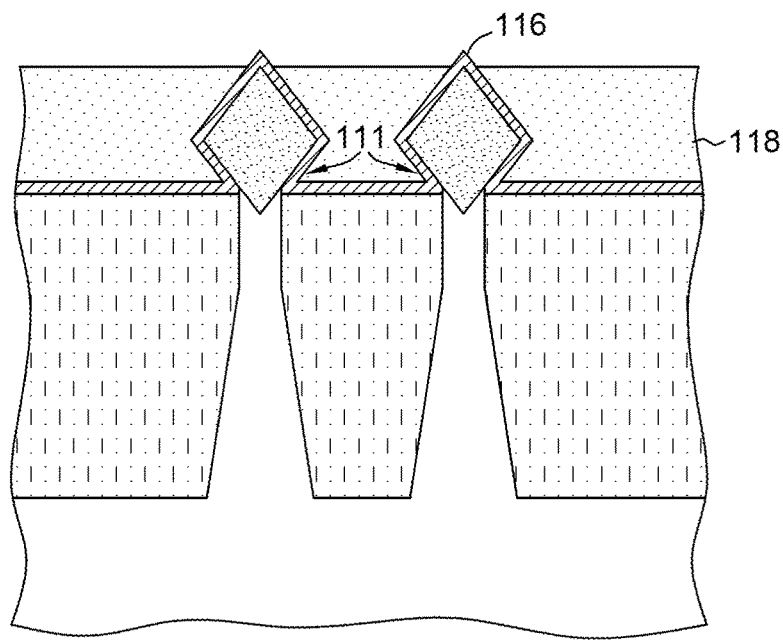
FIG. 6 depicts one example of the structure of FIG. 5 after etching the top layer of filler material using the layer of protective material as a stop in accordance with one or more aspects of the present invention.
Figure 7:
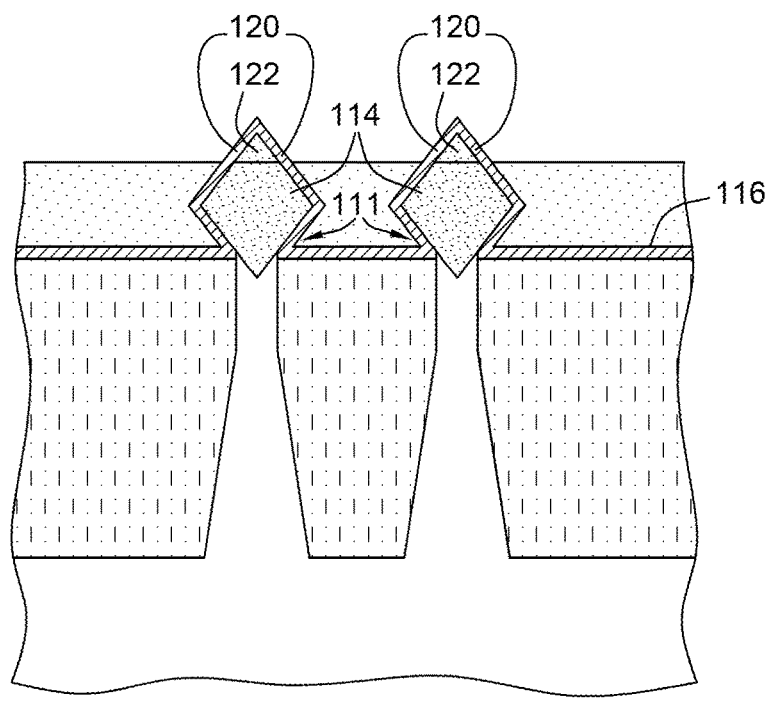
FIG. 7 depicts one example of the structure of FIG. 6 after further etching the top layer of filler material to expose a portion of the protective layer covering the epitaxial structures in accordance with one or more aspects of the present invention.
Figure 8:
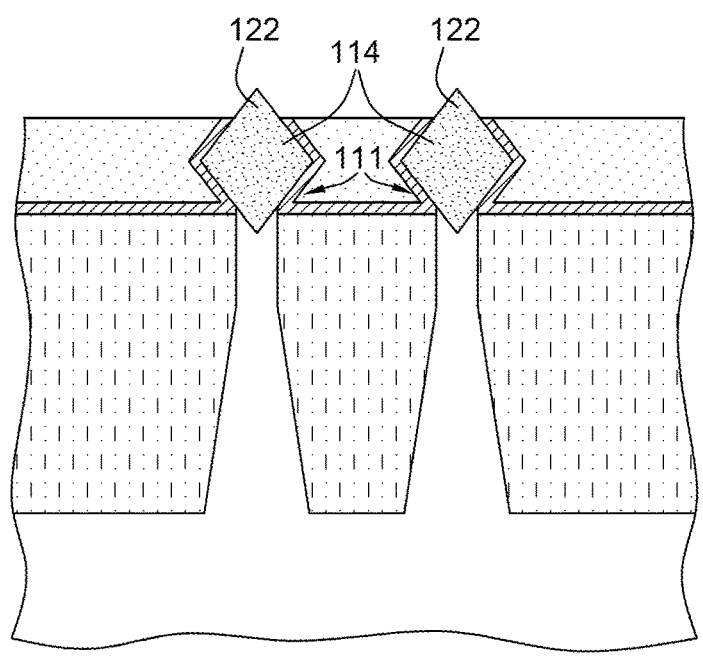
FIG. 8 depicts one example of the structure of FIG. 7 after etching the exposed protective layer to expose the portion of the epitaxial structure in accordance with one or more aspects of the present invention.
Figure 9:
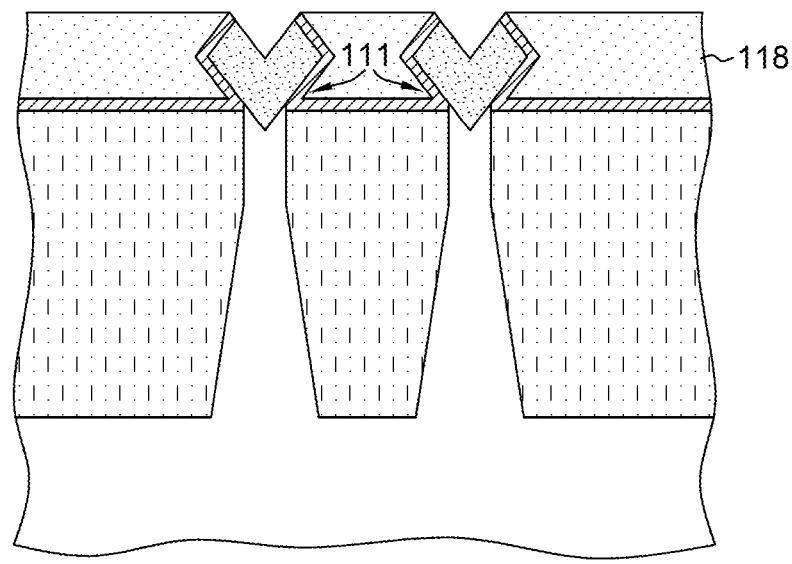
FIG. 9 depicts one example of the structure of FIG. 8 after removing the exposed portion of the epitaxial structure in accordance with one or more aspects of the present invention.

As shown in FIGS. 4-9, the method further includes increasing the surface area of the epitaxial structure(s) without growing additional epitaxy. Increasing the surface area may include, for example, removing portion(s) of the epitaxial structure(s). Where increasing the surface area includes removing portion(s) of the epitaxial structure(s), the removing may include conformally covering the epitaxial structure(s) with a layer 116 of one or more protective first material(s), for example, a nitride. Next, as shown in FIG. 5, the protective layer may be conformally covered with a second layer 118 of one or more second material(s), for example, a filler material similar to or the same as filler layer 106. As shown in FIGS. 6 and 7, the filler layer is etched, using, for example, protective layer 116 as a stop. The filler layer 118 may further be etched to expose a portion 120 of the protective layer covering a portion 122 of epitaxial structures 114 sought to be removed. The exposed protective layer may then be selectively etched to expose the portion(s) 122 of the epitaxial structure(s). Once exposed, as shown in FIG. 9, the portion(s) of the epitaxial structure(s) may be removed.

Figure 10:
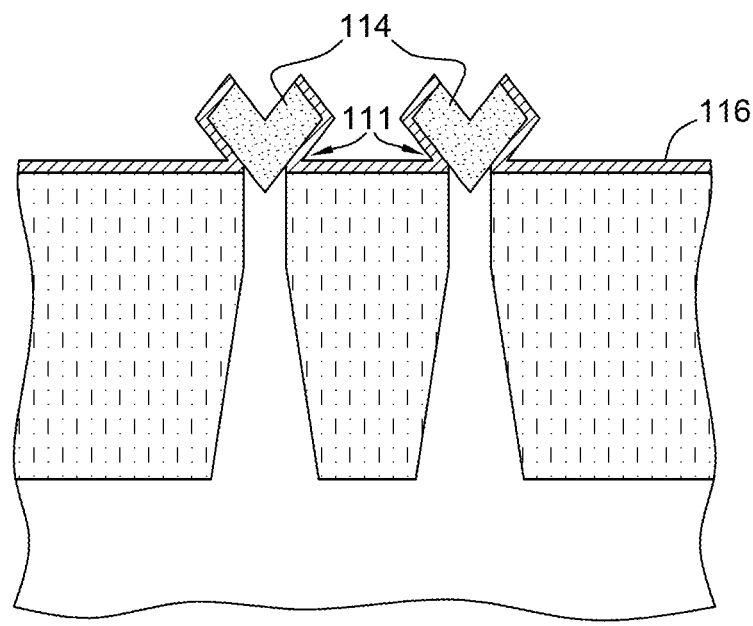
FIG. 10 depicts one example of the structure of FIG. 9 after removal of the remaining filler material above the layer of protective material in accordance with one or more aspects of the present invention.
Figure 11:
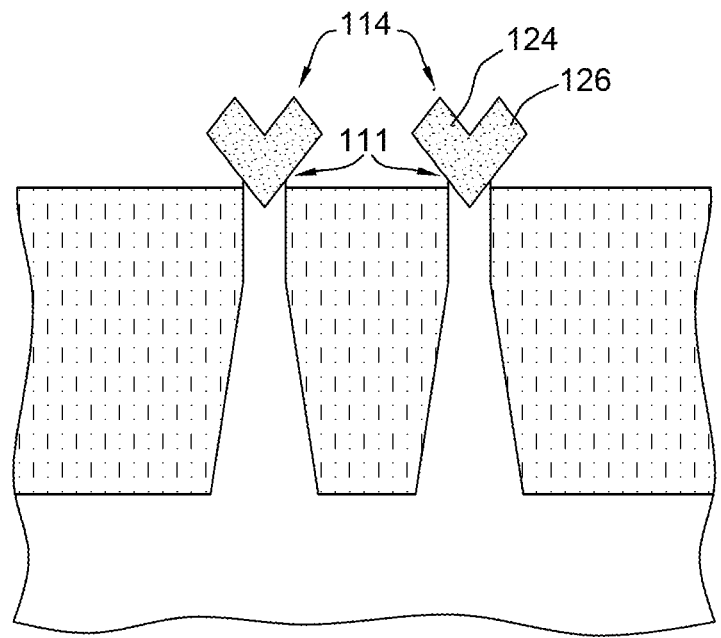
FIG. 11 depicts one example of the structure of FIG. 10 after removal of the layer of protective material to expose the epitaxial structure in accordance with one or more aspects of the present invention.
Figure 12:
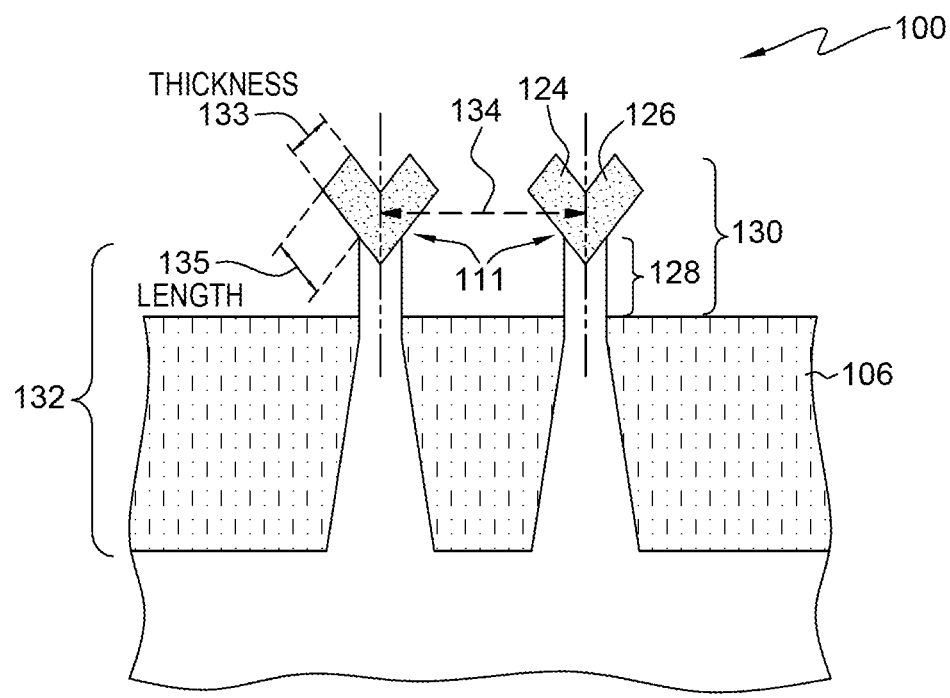
FIG. 12 depicts one example of the structure of FIG. 11 after etching of the filler material below the epitaxial structure to expose the neck of the raised structure in accordance with one or more aspects of the present invention.

As shown in FIG. 10, the remaining filler material (118, FIG. 9) is removed, for example, using a wet or dry etch, exposing the protective layer 116. As shown in FIG. 11, the protective layer may then be removed (e.g., using a wet etch where the protective material is a nitride), revealing the etched epitaxial structures 114. In the present example, using epitaxial silicon, removing the portion of the epitaxial structure (122, FIG. 8) results in a two-headed epitaxial structure (e.g., heads 124 and 126), the heads sharing the common base 111. Recessing filler material layer 106 reveals a neck portion 128 of the raised structure(s), the neck portion together with the dual-head epitaxial structure resembling a Y-shape.

In one example, a height 130 of the raised structures above the filler layer 106 may be about 20 nm to about 100 nm. The neck 128 of the raised semiconductor structure(s) may have a height of about 10 nm to about 80 nm, and fin heads 124 and 126 may be about 5 nm to about 20 nm in thickness 133 and about 5 nm to about 60 nm in length 135.

Where the non-planar semiconductor structure includes two or more raised semiconductor structures, in one example, a distance 134 between tips of bodies of the raised structures may be between about 20 nm and about 100 nm.

In another example, the non-planar structure includes a second raised semiconductor structure(s) without the epitaxial head structures. In one example, the second raised structure(s) has no epitaxial structure. In another example, the second raised structure(s) includes an epitaxial structure(s) on a top surface thereof that does not include head structures.

In another example, the raised structure(s) includes a first raised structure(s) and a second raised structure(s), growing the epitaxial structure(s) and increasing the surface area being performed only on the first raised structure(s). Growing the epitaxial structure(s) includes, for example, prior to recessing the exposed top surface: masking the raised structure(s); and recessing the filler layer surrounding the first raised structure(s).

Figure 13:
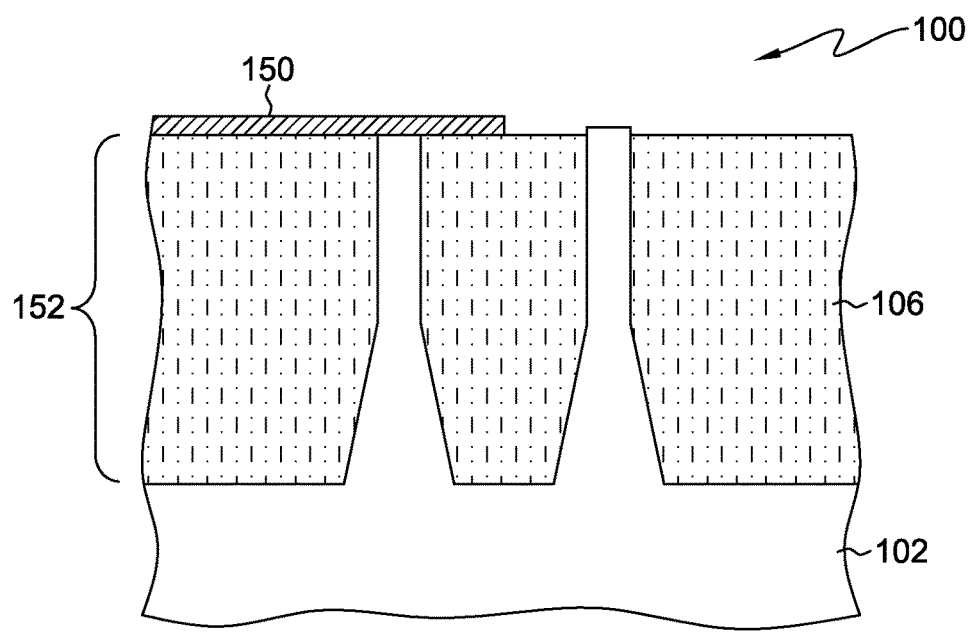
FIG. 13 depicts one example of the starting structure of FIG. 1 after masking a raised structure not intended to receive an epitaxial structure in accordance with one or more aspects of the present invention.

FIG. 13 depicts one example of the starting structure 100 of FIG. 1 after masking 150 a raised structure 152 not intended to receive an epitaxial structure ("non-epitaxy raised structure"). In one example, the mask includes a nitride hard mask, which may be, for example, blanketly deposited using, e.g., CVD (chemical vapor disposition), PECVD (plasma enhanced CVD), or ALD (atomic layer deposition), and then patterned via, for example, lithography, followed by a dry etch of the nitride.

Figure 14:
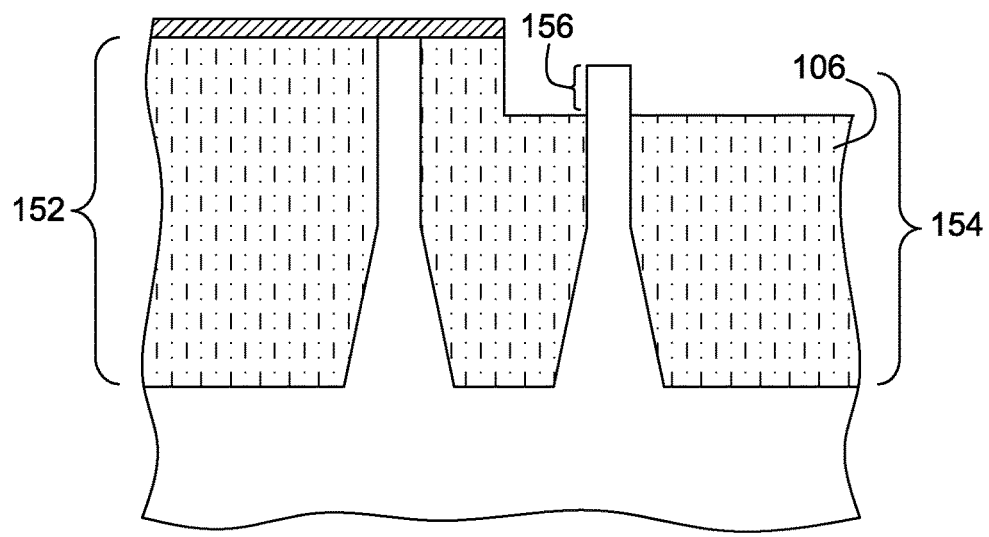
FIG. 14 depicts one example of the structure of FIG. 13 after recessing the filler layer surrounding the raised structure to receive an epitaxial structure, exposing a portion of the neck of the raised structure, in accordance with one or more aspects of the present invention.

FIG. 14 depicts one example of the structure of FIG. 13 after recessing the filler layer 106 surrounding the raised structure 154 to receive an epitaxial structure, exposing a portion 156 of the neck of the raised structure. The layer of filler material surrounding the raised structures, for example, an oxide created by, e.g., a shallow trench isolation process, is preferably recessed an amount that will allow the epi 154 and non-epi 152 raised structures to be uniform in height. In one example, where the filler material is an oxide, a controlled dry etch, or a combination of wet etch and dry etch may be used to accomplish the recess.

Figure 15:
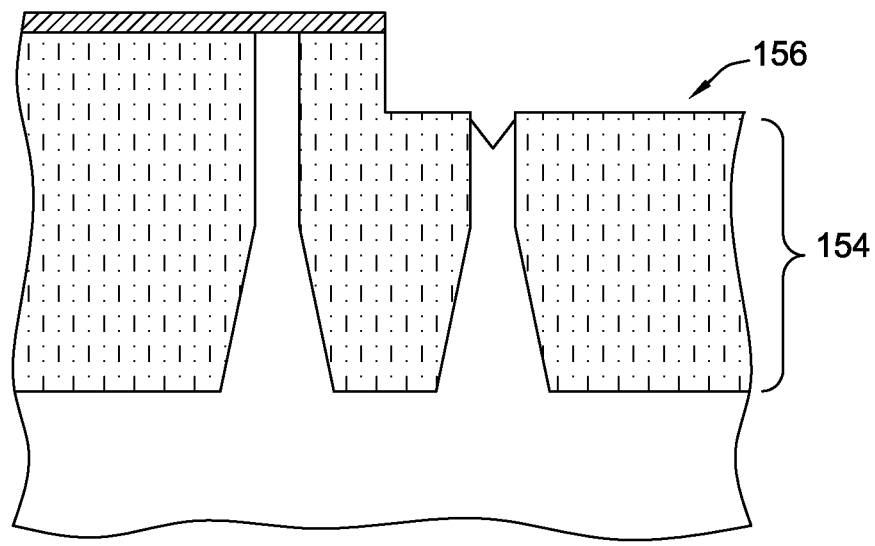
FIG. 15 depicts one example of the structure of FIG. 14 after recessing the raised structure below a top surface of the filler layer in accordance with one or more aspects of the present invention.

FIG. 15 depicts one example of the structure of FIG. 14 after recessing raised structure 152 below a top surface 156 of the filler layer. In one example, the raised structure includes silicon, and the recessing may be accomplished using a wet etch.

Figure 16:
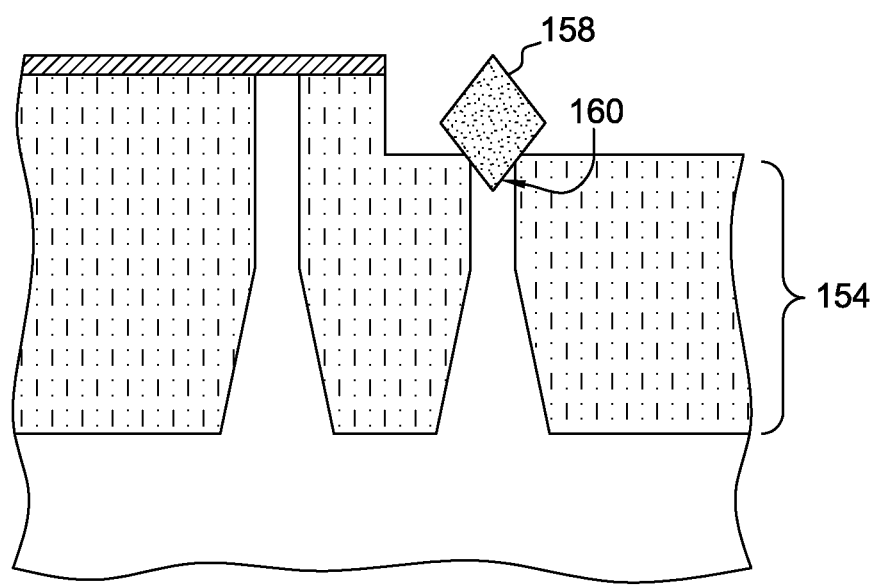
FIG. 16 depicts one example of the structure of FIG. 15 after growing an epitaxial structure on a top surface of the recessed raised structure in accordance with one or more aspects of the present invention.

FIG. 16 depicts one example of the structure of FIG. 15 after growing an epitaxial structure 158 on a top surface 160 of the recessed raised structure 154. In one example, the epitaxial structure includes silicon or silicon germanium, and may be grown by, for example, vapor-phase epitaxy, molecular-beam epitaxy, or liquid-phase epitaxy. More generally, the epitaxial material may be a single semiconductor material or a combination from Groups III-V of the Periodic Table of Elements. As one skilled in the art will know, silicon-containing epitaxial material naturally grows into diamond-shaped structures.

Figure 17:
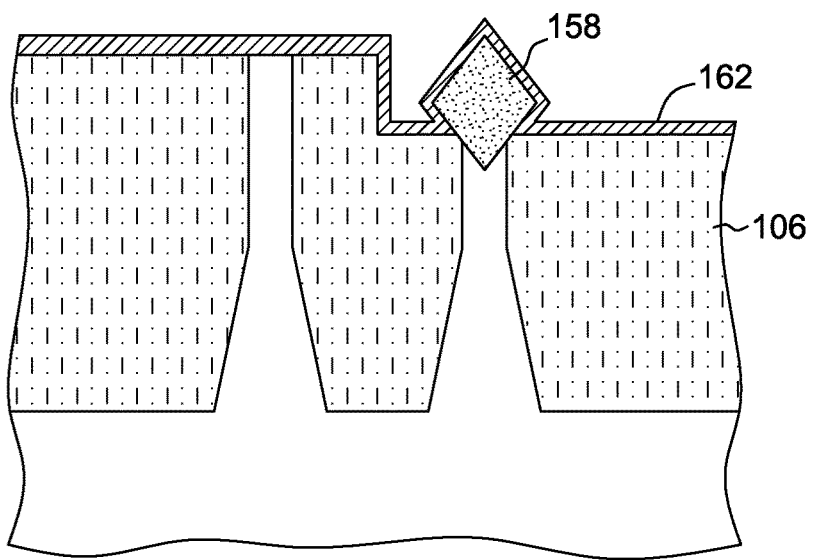
FIG. 17 depicts one example of the structure of FIG. 16 after creating a conformal layer of protective material over the epitaxial structure in accordance with one or more aspects of the present invention.

FIG. 17 depicts one example of the structure of FIG. 16 after creating a conformal layer 162 of protective material over the epitaxial structure 158 and surrounding filler material 106. In one example, the protective material is the same as that of the mask 150 over the non-epi raised structure 152, for example, a nitride.

Figure 18:
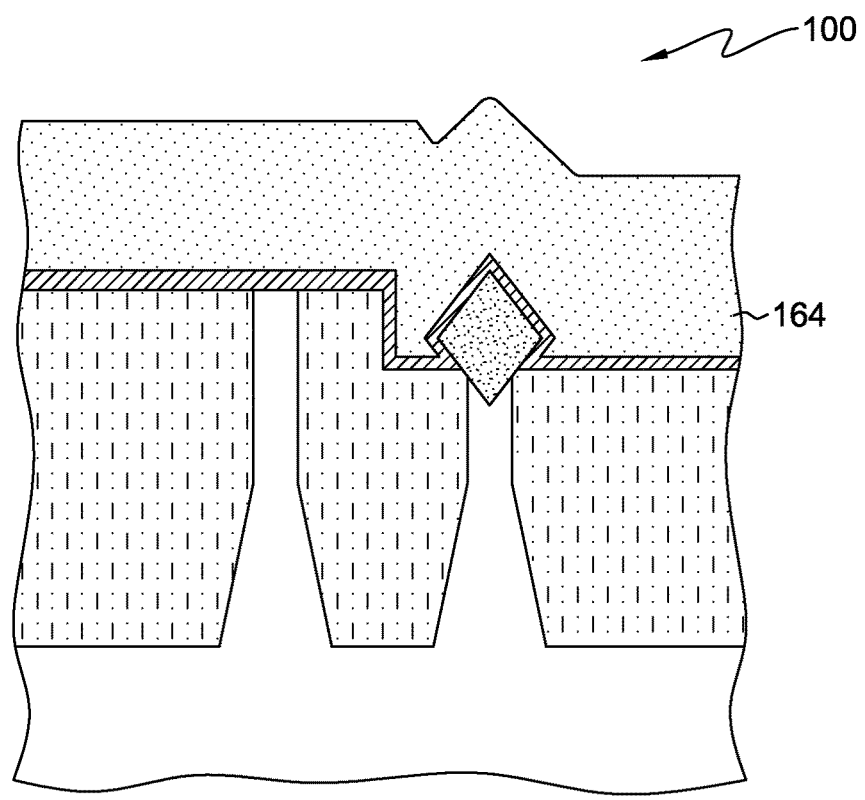
FIG. 18 depicts one example of the structure of FIG. 17 after blanketly depositing a conformal layer of filler material over the semiconductor structure in accordance with one or more aspects of the present invention.

FIG. 18 depicts one example of the structure of FIG. 17 after blanketly depositing a conformal layer 164 of filler material over the non-planar semiconductor structure 100. In one example, the filler material is an oxide that may be deposited using, for example, CVD, PECVD, or ALD. Preferably, the filler material chosen may be etched selective to the protective material below.

Figure 19:
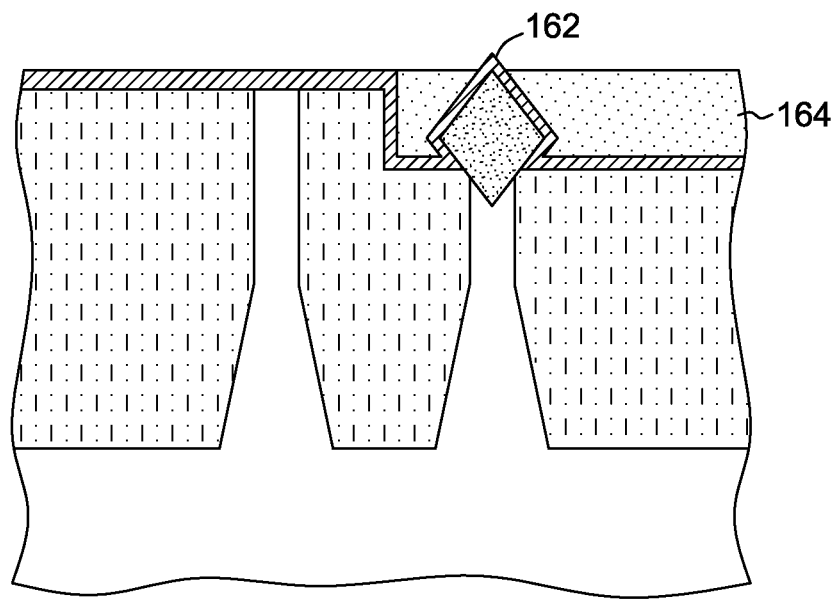
FIG. 19 depicts one example of the structure of FIG. 18 after etching the blanket filler layer and using the protective material as a stop in accordance with one or more aspects of the present invention.

FIG. 19 depicts one example of the structure of FIG. 18 after etching the blanket filler layer 164, using the protective material 162 as a stop. In one example, the protective material includes a nitride, the filler material includes an oxide, and the etching may be accomplished using, for example, chemical mechanical polishing.

Figure 20:
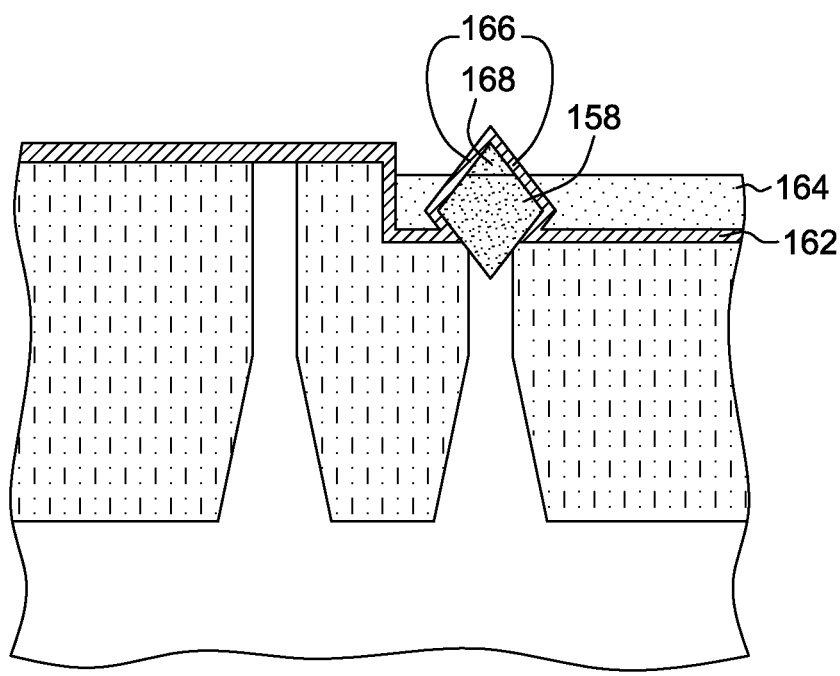
FIG. 20 depicts one example of the structure of FIG. 19 after further etching the filler layer to expose a portion of the protective layer over the epitaxial structure where a portion of the epitaxial structure will subsequently be removed in accordance with one or more aspects of the present invention.

FIG. 20 depicts one example of the structure of FIG. 19 after further etching the filler layer 164 to expose a portion 166 of the protective layer 162 over the epitaxial structure 158 where a portion 168 of the epitaxial structure will subsequently be removed.

Figure 21:
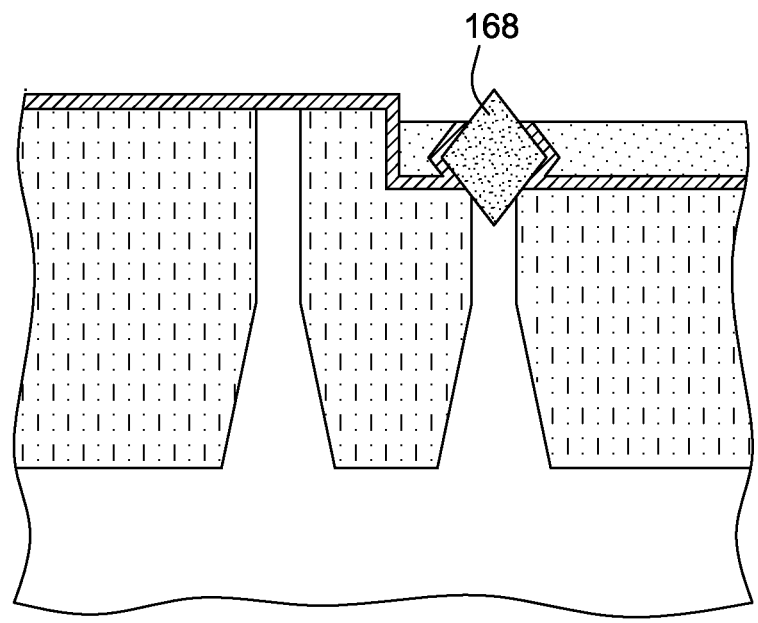
FIG. 21 depicts one example of the structure of FIG. 20 after selective removal of the protective material to expose the portion of the epitaxial structure intended to be removed in accordance with one or more aspects of the present invention.

FIG. 21 depicts one example of the structure of FIG. 20 after selective removal of the portion 166 of the protective material to expose the portion 168 of the epitaxial structure intended to be removed.

Figure 22:
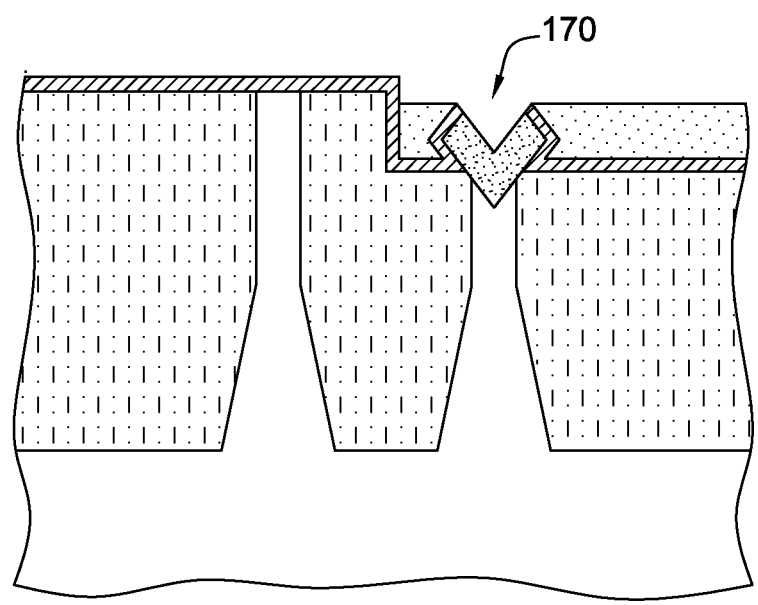
FIG. 22 depicts one example of the structure of FIG. 21 after removal of the portion of the epitaxial structure in accordance with one or more aspects of the present invention.

FIG. 22 depicts one example of the structure of FIG. 21 after removal 170 of the portion of the epitaxial structure. As better appreciated in FIG. 23, removal of the epitaxial portion results in a larger surface area at a top thereof where current will flow. In addition, due to the diamond-shaped structure of silicon-containing epitaxial growth, multiple head (in this example, two heads 172, 174) are created in the epitaxial structure 158.

Figure 23:
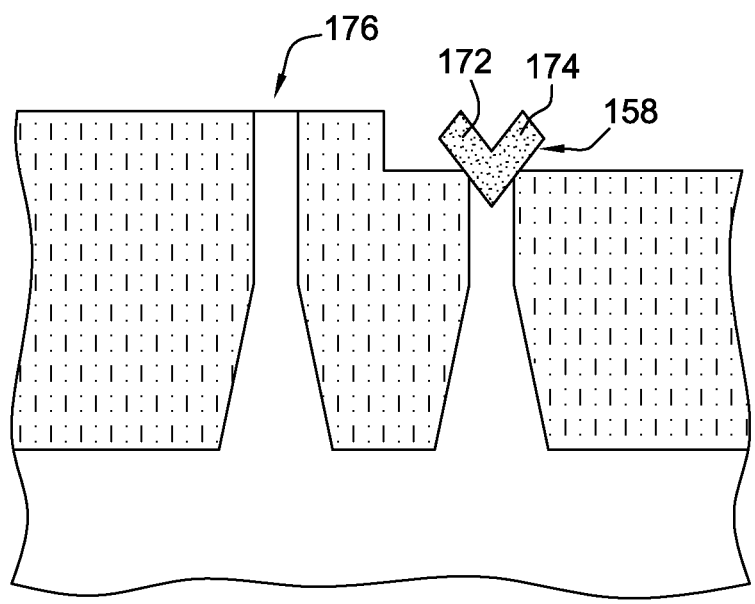
FIG. 23 depicts one example of the structure of FIG. 22 after removal of the remaining filler material above the protective layer, as well as the protective layer, exposing a top surface of the other raised structure and the epitaxial structure in accordance with one or more aspects of the present invention.

FIG. 23 depicts one example of the structure of FIG. 22 after removal of the remaining filler material above the protective layer, as well as removal of the protective layer, exposing the modified epitaxial structure 158 and a top surface 176 of the non-epi raised structure. Preferably, the remaining filler material and the protective layer are removed in a same process. For example, where the filler material is an oxide and the protective layer is a nitride, they may be commonly removed using, for example, a wet etch, a dry etch or a combination of the two processes.

Figure 24:
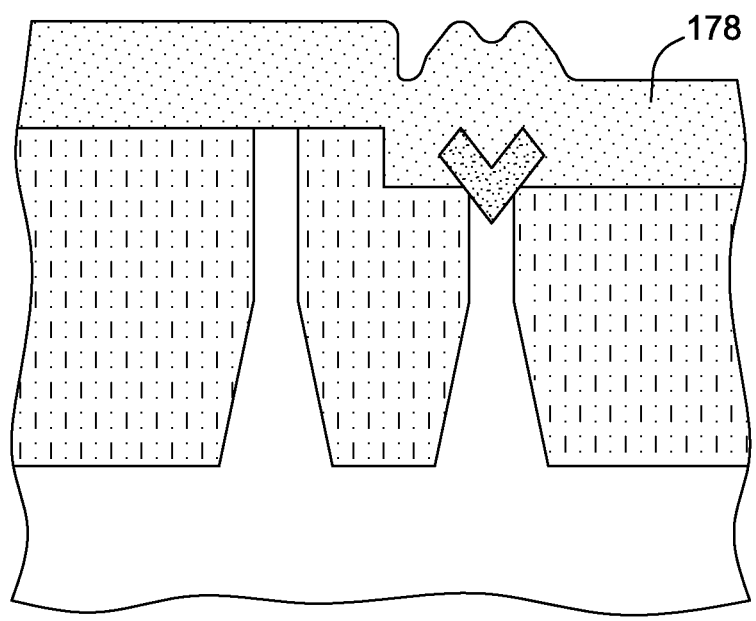
FIG. 24 depicts one example of the structure of FIG. 23 after blanketly depositing a conformal layer of filler material above the exposed raised structure and epitaxial structure in accordance with one or more aspects of the present invention.

FIG. 24 depicts one example of the structure of FIG. 23 after blanketly depositing a conformal layer 178 of filler material above the exposed non-epi raised structure surface 176 and modified epitaxial structure 158. In one example, the filler material is an oxide and the deposition may be accomplished using, for example, CVD, PECVD, or ALD.

Figure 25:
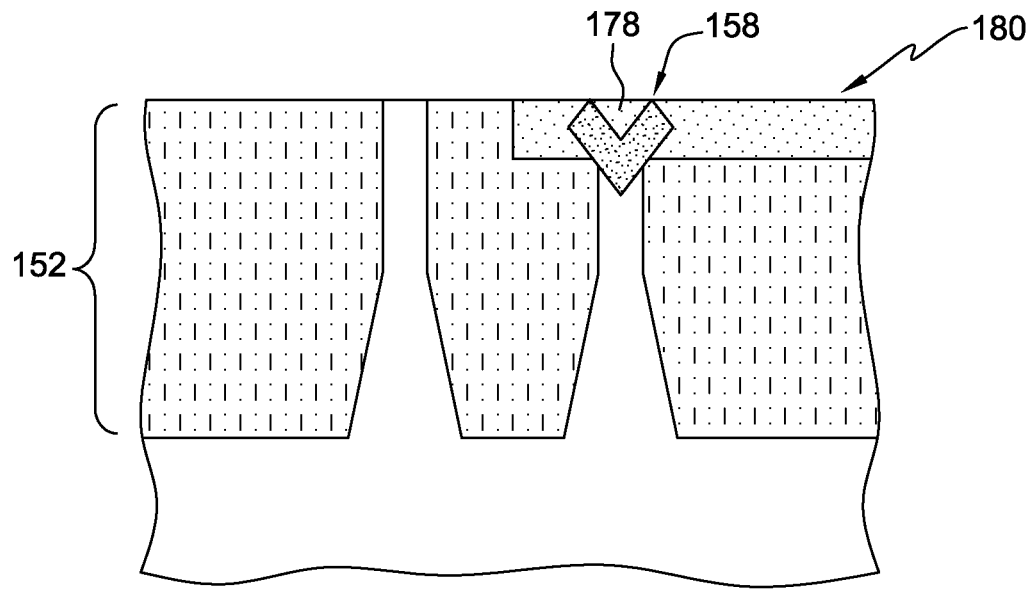
FIG. 25 depicts one example of the structure of FIG. 24 after planarizing the conformal filler layer using the material(s) of the raised structure and the epitaxial structure as a stop in accordance with one or more aspects of the present invention.

FIG. 25 depicts one example of the structure of FIG. 24 after planarizing 180 the conformal filler layer 178 using the material(s) of the non-epi raised structure and the modified epitaxial structure as a stop. In one example, the filler material includes an oxide, the material of the raised structure includes silicon, the epitaxial material includes silicon, and chemical mechanical polishing may be used to planarize.

Figure 26:
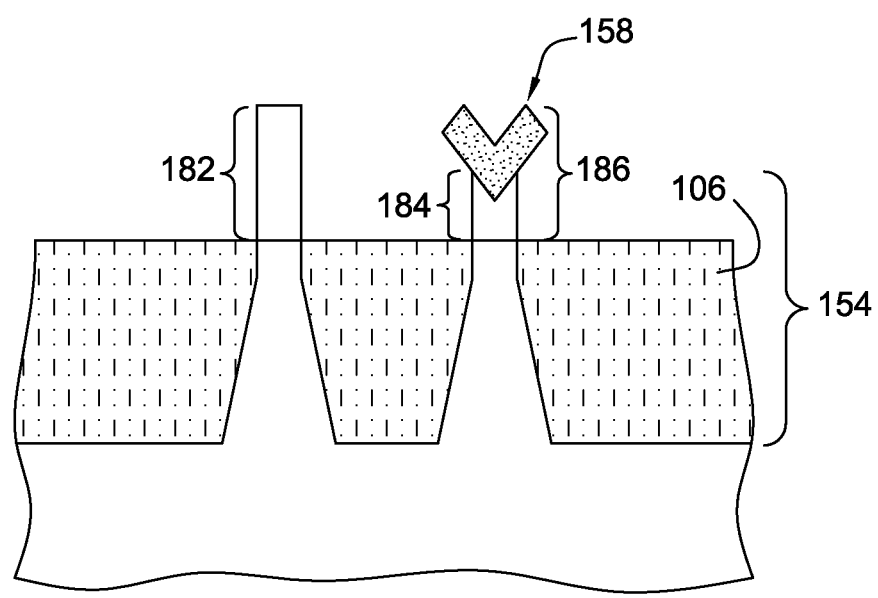
FIG. 26 depicts one example of the structure of FIG. 25 after etching the filler material to exposed neck portions of the raised structures in accordance with one or more aspects of the present invention.

FIG. 26 depicts one example of the structure of FIG. 25 after etching the filler material 106 to expose neck portions 182, 184 of the raised structures. In one example, the modified epitaxial structure 158 together with the neck portion 184 of raised structure 154 resemble a Y-shape 186.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A non-planar semiconductor structure, comprising:
    a semiconductor substrate;
    at least one raised semiconductor structure coupled to the substrate; and
    at least one epitaxial structure on one or more of the at least one raised semiconductor structure, wherein the at least one epitaxial structure comprises a common base partially recessed in the at least one raised semiconductor structure, and at least two epitaxial head structures joined together at the common base of the at least one epitaxial structure.

2. The non-planar semiconductor structure of claim 1, wherein a body of the at least one raised semiconductor structure has a height of about 30 nm to about 50 nm.

3. The non-planar semiconductor structure of claim 2, wherein the at least one epitaxial structure has a height of about 10 nm to about 20 nm.

4. The non-planar semiconductor structure of claim 1, wherein the at least one raised semiconductor structure comprises at least two raised semiconductor structures, and wherein a distance between tips of bodies of the at least two raised semiconductor structures is between about 20 nm and about 40 nm.

5. The non-planar semiconductor structure of claim 1, wherein the at least one epitaxial structure comprises silicon.

6. The non-planar semiconductor structure of claim 1, wherein the at least one epitaxial structure comprises germanium.

7. The non-planar semiconductor structure of claim 1, wherein the at least one epitaxial structure comprises silicon germanium.

8. The non-planar semiconductor structure of claim 1, wherein the at least one epitaxial structure comprises a combination of at least two materials from Groups III-V of the Periodic Table of Elements.

9. The non-planar semiconductor structure of claim 1, further comprising at least one second raised semiconductor structure without the at least two epitaxial head structures.

10. The non-planar semiconductor structure of claim 1, wherein the at least two epitaxial head structures and the common base form a Y shape.

* * * * *